(12) United States Patent
Tan et al.

(10) Patent No.: US 11,306,974 B2
(45) Date of Patent: Apr. 19, 2022

(54) TEMPERATURE PLATE AND HEAT DISSIPATION DEVICE

(71) Applicant: DELTA ELECTRONICS, INC., Taoyuan (TW)

(72) Inventors: Li-Kuang Tan, Taoyuan (TW); Shih-Kang Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 3 days.

(21) Appl. No.: 15/624,300

(22) Filed: Jun. 15, 2017

(65) Prior Publication Data

US 2017/0363366 A1 Dec. 21, 2017

Related U.S. Application Data

(60) Provisional application No. 62/350,373, filed on Jun. 15, 2016.

(30) Foreign Application Priority Data

Jun. 6, 2017 (CN) .......................... 201710417049.0

(51) Int. Cl.
  *F28D 15/02* (2006.01)
  *F28D 15/04* (2006.01)
  (Continued)

(52) U.S. Cl.
  CPC ..... *F28D 15/0275* (2013.01); *F28D 15/0233* (2013.01); *F28D 15/04* (2013.01);
  (Continued)

(58) Field of Classification Search
  CPC .. F28D 15/0275; F28D 15/04; F28D 15/0233; F28D 2021/0028; H01L 33/64;
  (Continued)

(56) References Cited

U.S. PATENT DOCUMENTS 3,404,061 A * 10/1968 Bochman ................ C04B 20/06
  428/143
4,040,478 A * 8/1977 Pogson ............... F28D 15/0241
  165/46

(Continued)

FOREIGN PATENT DOCUMENTS

CN       2765439 Y      3/2006
CN       2770285 Y      4/2006
  (Continued)

*Primary Examiner* — Ljiljana V. Ciric
(74) *Attorney, Agent, or Firm* — Muncy, Geissler, Olds & Lowe, P.C.

(57) ABSTRACT

A temperature plate includes a plate body and at least two supporters. The plate body has a first plate and a second plate, and a vacuum chamber is defined by the first plate and the second plate. The first plate has a first external surface, and the plate body is bent to form at least two bent portions with the first external surface being a compressive side, and the supporters are disposed inside the vacuum chamber and connected to an inner wall of the vacuum chamber to enhance a structural strength of the bent portions and also to improve heat conduction, wherein the temperature plate is combined with a cooling fin assembly, the cooling fin assembly is disposed on the first external surface. When the number of the bent portions are two, the configuration of the two bent portions allows the plate body to clip the cooling fin assembly.

7 Claims, 8 Drawing Sheets

(51) Int. Cl.
   *F28F 3/06* (2006.01)
   *H01L 33/64* (2010.01)
   *H01L 23/427* (2006.01)
   *F28F 9/007* (2006.01)
   *F28D 21/00* (2006.01)
   *F21V 29/74* (2015.01)
   *F21Y 115/10* (2016.01)
   *H01L 23/367* (2006.01)

(52) U.S. Cl.
   CPC .............. *F28F 3/06* (2013.01); *H01L 23/427* (2013.01); *H01L 33/64* (2013.01); *F21V 29/74* (2015.01); *F21Y 2115/10* (2016.08); *F28D 2021/0028* (2013.01); *F28F 9/0075* (2013.01); *F28F 2275/08* (2013.01); *H01L 23/3672* (2013.01)

(58) Field of Classification Search
   CPC ...... H01L 23/427; H01L 23/3672; F28F 3/06; F28F 9/0075; F28F 2275/08; F21Y 2115/10; F21V 29/74
   See application file for complete search history.

(56) References Cited

U.S. PATENT DOCUMENTS

| | | | | |
|---|---|---|---|---|
| 4,047,198 | A * | 9/1977 | Sekhon | H01L 23/427 257/713 |
| 4,402,358 | A * | 9/1983 | Wolf | F28D 15/04 165/104.26 |
| 4,461,343 | A * | 7/1984 | Token | F28D 15/0233 165/104.26 |
| 4,849,858 | A * | 7/1989 | Grapes | H05K 1/0203 361/708 |
| 5,343,940 | A * | 9/1994 | Jean | F28D 15/0241 165/104.33 |
| 5,560,423 | A * | 10/1996 | Larson | F28D 15/0241 165/104.26 |
| 5,769,154 | A * | 6/1998 | Adkins | F28D 15/0233 126/96 |
| 5,769,158 | A * | 6/1998 | Yao | F28F 13/00 165/185 |
| 5,924,481 | A * | 7/1999 | Tajima | F28D 15/0266 165/104.33 |
| 6,056,044 | A * | 5/2000 | Benson | F28D 15/0233 165/104.26 |
| 6,082,443 | A * | 7/2000 | Yamamoto | F28D 15/0233 165/104.21 |
| 6,164,368 | A * | 12/2000 | Furukawa | F28D 15/0233 165/104.33 |
| 6,167,948 | B1 * | 1/2001 | Thomas | F28D 15/02 165/104.26 |
| 6,257,328 | B1 * | 7/2001 | Fujiwara | F28F 13/00 165/185 |
| 6,302,192 | B1 * | 10/2001 | Dussinger | F28D 15/0233 165/104.21 |
| 6,504,720 | B2 * | 1/2003 | Furuya | H01L 23/427 165/104.33 |
| 6,650,544 | B1 * | 11/2003 | Lai | F28D 15/046 165/104.21 |
| 6,721,182 | B1 * | 4/2004 | Wells | H05K 7/1404 257/727 |
| 6,725,910 | B2 * | 4/2004 | Ishida | B21C 37/151 165/104.21 |
| 6,765,798 | B1 * | 7/2004 | Ratliff | H05K 7/20445 165/185 |
| 6,840,311 | B2 * | 1/2005 | Ghosh | F28D 15/0233 165/104.33 |
| 6,901,994 | B1 * | 6/2005 | Jin-Cherng | F28D 15/046 165/104.26 |
| 6,914,780 | B1 * | 7/2005 | Shanker | F28D 15/0233 165/104.33 |
| 6,997,245 | B2 * | 2/2006 | Lindemuth | B22F 7/004 165/104.21 |
| 7,066,240 | B2 * | 6/2006 | Dussinger | F28D 15/0233 165/104.26 |
| 7,237,338 | B2 * | 7/2007 | Lin | F28D 15/0275 29/890.032 |
| 7,278,469 | B2 * | 10/2007 | Sasaki | F28D 15/0241 165/104.26 |
| 7,393,587 | B2 * | 7/2008 | Krassowski | H01L 23/373 428/408 |
| 7,656,665 | B2 * | 2/2010 | Lin | G06F 1/203 361/700 |
| 7,663,883 | B2 * | 2/2010 | Shirakami | H01L 23/373 165/46 |
| 7,794,868 | B2 * | 9/2010 | Yang | H01M 2/1016 429/120 |
| 7,857,037 | B2 * | 12/2010 | Parish | F28D 15/0233 165/104.21 |
| 7,961,467 | B2 * | 6/2011 | Hongo | G06F 1/203 165/104.26 |
| 8,074,706 | B2 * | 12/2011 | Su | F28D 15/046 165/104.26 |
| 8,098,490 | B2 * | 1/2012 | Hata | F28D 15/0233 165/104.33 |
| 8,270,166 | B2 * | 9/2012 | Chen | F28D 15/0233 165/104.33 |
| 8,780,559 | B2 * | 7/2014 | Weaver, Jr. | H01L 23/427 165/104.21 |
| 8,811,014 | B2 * | 8/2014 | Chauhan | H01L 23/427 361/700 |
| 9,429,370 | B1 * | 8/2016 | Thomsen | F28D 15/0275 |
| 9,549,486 | B2 * | 1/2017 | Yang | F28D 15/04 |
| 9,625,215 | B2 * | 4/2017 | Hsiao | F28D 15/04 |
| 10,186,472 | B2 * | 1/2019 | Kenna | B23P 15/26 |
| 10,228,194 | B2 * | 3/2019 | Zhao | F28D 15/046 |
| 10,448,540 | B2 * | 10/2019 | Hou | H01L 21/4882 |
| 10,458,716 | B2 * | 10/2019 | Hulse | F28D 15/0233 |
| 10,517,192 | B2 * | 12/2019 | Hsiao | F28D 15/0233 |
| 10,619,941 | B2 * | 4/2020 | Huang | F28F 3/12 |
| 10,670,650 | B2 * | 6/2020 | Wolff | F28D 15/0275 |
| 10,739,081 | B2 * | 8/2020 | Zhou | B23P 15/26 |
| 10,973,151 | B2 * | 4/2021 | Wakaoka | F28D 15/046 |
| 2001/0047859 | A1 * | 12/2001 | Ishida | B21C 37/151 165/104.14 |
| 2002/0062648 | A1 * | 5/2002 | Ghoshal | F28D 15/0233 62/3.7 |
| 2003/0024691 | A1 * | 2/2003 | Tsay | F28D 15/0233 165/104.26 |
| 2006/0144561 | A1 * | 7/2006 | Lin | H01L 23/427 165/80.3 |
| 2006/0144571 | A1 * | 7/2006 | Lin | F28D 15/0233 165/104.33 |
| 2007/0068657 | A1 * | 3/2007 | Yamamoto | F28D 15/0233 165/104.26 |
| 2007/0127210 | A1 * | 6/2007 | Mahalingam | G06F 1/20 361/700 |
| 2008/0066891 | A1 * | 3/2008 | Jeng | F28D 15/00 165/104.26 |
| 2008/0198554 | A1 * | 8/2008 | Holmberg | F28D 15/0266 361/709 |
| 2008/0210407 | A1 * | 9/2008 | Kim | F28D 15/0233 165/104.26 |
| 2008/0291630 | A1 * | 11/2008 | Monh | F28D 15/0266 361/700 |
| 2009/0014160 | A1 * | 1/2009 | Hsiao | H01L 23/427 165/121 |
| 2009/0071632 | A1 * | 3/2009 | Bryant | F28D 15/0241 165/104.26 |
| 2010/0084113 | A1 * | 4/2010 | Lee | F28D 15/046 165/46 |
| 2010/0195280 | A1 * | 8/2010 | Huang | F28D 15/0266 361/679.47 |
| 2010/0309671 | A1 * | 12/2010 | Meyer, IV | F21K 9/00 362/373 |
| 2011/0048679 | A1 * | 3/2011 | Hsieh | F28D 15/0233 165/104.26 |

(56) References Cited

U.S. PATENT DOCUMENTS

| | | | | |
|---|---|---|---|---|
| 2011/0088874 A1* | 4/2011 | Meyer, IV | F28D 15/046 | 165/104.26 |
| 2011/0100608 A1* | 5/2011 | Huang | F28D 15/0233 | 165/104.26 |
| 2011/0103017 A1* | 5/2011 | Yu | H01L 23/4093 | 361/697 |
| 2011/0315359 A1* | 12/2011 | Shih | F28F 1/20 | 165/121 |
| 2012/0085518 A1* | 4/2012 | Ichkahn | F28D 15/0275 | 165/104.26 |
| 2012/0160456 A1* | 6/2012 | Aoki | G06F 1/20 | 165/104.26 |
| 2013/0118717 A1* | 5/2013 | Lin | F28D 15/0233 | 165/104.26 |
| 2013/0168050 A1* | 7/2013 | Chauhan | H01L 23/427 | 165/104.21 |
| 2013/0233518 A1* | 9/2013 | Liu | F28D 15/0233 | 165/104.26 |
| 2013/0233520 A1* | 9/2013 | Lo | F28D 15/0233 | 165/104.26 |
| 2014/0060780 A1* | 3/2014 | Moon | H05K 7/20336 | 165/104.21 |
| 2014/0131013 A1* | 5/2014 | Horng | F28D 15/0233 | 165/104.26 |
| 2014/0138056 A1* | 5/2014 | Horng | F28F 3/048 | 165/104.21 |
| 2014/0182817 A1* | 7/2014 | Yu | G06F 1/20 | 165/104.21 |
| 2014/0360701 A1* | 12/2014 | Aoki | H01L 23/427 | 165/104.21 |
| 2015/0189792 A1* | 7/2015 | Kenna | B23P 15/26 | 361/704 |
| 2015/0258643 A1* | 9/2015 | Lin | B23P 15/26 | 29/890.03 |
| 2015/0260388 A1* | 9/2015 | Geels | F21V 29/006 | 362/373 |
| 2016/0132081 A1* | 5/2016 | Wu | G06F 1/203 | 361/679.03 |
| 2017/0080533 A1* | 3/2017 | Lin | B23P 15/26 | |
| 2017/0082377 A1* | 3/2017 | Lin | F28F 3/02 | |
| 2017/0284738 A1* | 10/2017 | Watanabe | F28F 9/0131 | |
| 2018/0010861 A1* | 1/2018 | Wakaoka | H01L 23/427 | |
| 2018/0017334 A1* | 1/2018 | Davis | H01L 35/08 | |
| 2018/0023416 A1* | 1/2018 | Riaz | F01D 17/145 | 415/1 |
| 2019/0162481 A1* | 5/2019 | Machida | F28D 15/0283 | |
| 2019/0293360 A1* | 9/2019 | McGlen | F28D 15/046 | |
| 2020/0100390 A1* | 3/2020 | Koo | F28F 21/06 | |
| 2020/0124352 A1* | 4/2020 | Wakaoka | H01L 23/427 | |
| 2020/0182556 A1* | 6/2020 | Liu | F28D 15/04 | |
| 2020/0221605 A1* | 7/2020 | Vanderwees | H05K 7/20336 | |
| 2020/0236810 A1* | 7/2020 | Wakaoka | H05K 7/20336 | |
| 2020/0248968 A1* | 8/2020 | Chen | F28D 15/046 | |
| 2020/0326131 A1* | 10/2020 | Hikichi | H01L 23/36 | |
| 2020/0326134 A1* | 10/2020 | Chen | F28D 15/0233 | |
| 2020/0333082 A1* | 10/2020 | Wakaoka | F28D 15/04 | |

FOREIGN PATENT DOCUMENTS

| | | |
|---|---|---|
| CN | 201207780 Y | 3/2009 |
| CN | 203337002 U | 12/2013 |

\* cited by examiner

TEMPERATURE PLATE AND HEAT DISSIPATION DEVICE

CROSS REFERENCE TO RELATED APPLICATIONS

The non-provisional patent application claims priority to U.S. provisional patent application with Ser. No. 62/350,373 filed on Jun. 15, 2016. This and all other extrinsic materials discussed herein are incorporated by reference in their entirety.

This Non-provisional application claims priority under 35 U.S.C. § 119(a) on Patent Application No(s). 201710417049.0 filed in People's Republic of China on Jun. 6, 2017, the entire contents of which are hereby incorporated by reference.

BACKGROUND OF THE DISCLOSURE

Field of Disclosure

The present disclosure relates to a temperature plate and a heat dissipation device. In particular, the present disclosure relates to a temperature plate with a bent structure and a heat dissipation device having a cooling fin assembly clipped by the bent structure.

Related Art

In general, the temperature plate is composed by metal plates by welding or assembling. The temperature plate has a vacuum chamber and is a high performance heat dissipation device for rapidly transferring heat from the heat source to a large dissipating surface. Accordingly, the heat dissipation device adapted with the temperature plate has been widely applied to various high-performance commercial devices, such as dissipating heat of servers, communication apparatuses, VGA, or high-performance LED.

In order to enhance the heat dissipating efficiency of the temperature plate, it is generally to bend the plate body of the temperature plate, so that the bent plate body can have a larger surface to be contacted with the cooling fin assembly or heat source. However, when applying a force to bend the plate body, the bent portion of the plate body usually has a depression or deformation, so as to decrease contact surface. Therefore, it is desired to eliminate or decrease the depression or deformation of the bent portion of the plate body.

SUMMARY OF THE DISCLOSURE

An objective of the disclosure is to provide a temperature plate that can prevent the depression or deformation while bending the plate body and can provide more conducting paths and a larger contact surface for improving the heat dissipating efficiency.

An objective of the disclosure is to provide a heat dissipation device adapting the temperature plate. The heat dissipation device has a cooling fin assembly disposed on the bent portion of the temperature plate for providing more conducting paths and a larger contact surface so as to improve the heat dissipating efficiency.

The present disclosure provides a temperature plate including a plate body and a supporter. The plate body includes a first plate and a second plate. A vacuum chamber is defined by the first plate and the second plate. The first plate has a first surface away from the vacuum chamber. The plate body is bent to form at least a bent portion with the first surface to be a compressive side. The supporter is disposed corresponding to the bent portion.

The present disclosure also provides a heat dissipation device including at least a temperature plate and a cooling fin assembly. The temperature plate includes a plate body and a supporter. The plate body includes a vacuum chamber and a first surface, and the plate body is bent to form at least a bent portion with the first surface to be a compressive side. The supporter is disposed corresponding to the bent portion. The cooling fin assembly is disposed on the first surface.

In one embodiment, a curvature radius of the bent portion is at least twice of a thickness of the bent portion. In addition, the second plate has a second surface away from the vacuum chamber, and the supporter is disposed in the vacuum chamber or on the first surface or on the second surface.

In one embodiment, the plate body is formed by a single plate workpiece.

In one embodiment, the supporter is a structural enhancement member.

In one embodiment, the first plate or the second plate has a plurality of protruding portions corresponding to the bent portion. The protruding portions construct the supporter, and the protruding portions are aligned or misaligned to each other.

In one embodiment, one of the first plate and the second plate has a plurality of protruding portions corresponding to the bent portion, and the other of the first plate and the second plate has a plurality of recess portions corresponding to the bent portion. The protruding portions and the recess portions construct the supporter, and the protruding portions are aligned or misaligned to the recess portions.

In one embodiment, the bent portion of the plate body clips the cooling fin assembly.

In one embodiment, the heat dissipation device further includes a heat conducting plate, and the temperature plate and the cooling fin assembly are disposed on the heat conducting plate.

As mentioned above, in the temperature plate and the heat dissipation device of the disclosure, the supporter is disposed corresponding to the bent portion of the plate body of the temperature plate for enhancing the structural strength of the bent portion. This configuration can prevent the depression or deformation of the temperature plate when bending the temperature plate. In addition, the cooling fin assembly is disposed at the compressive side of the bent plate body and contacted with the first surface of the plate body, so that more conducting paths and a larger contact surface can be provided between the outer surface of the temperature plate and the cooling fin assembly through the bent portion, thereby improving the heat dissipating efficiency.

BRIEF DESCRIPTION OF THE DRAWINGS

The present disclosure will become more fully understood from the subsequent detailed description and accompanying drawings, which are given by way of illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1A:
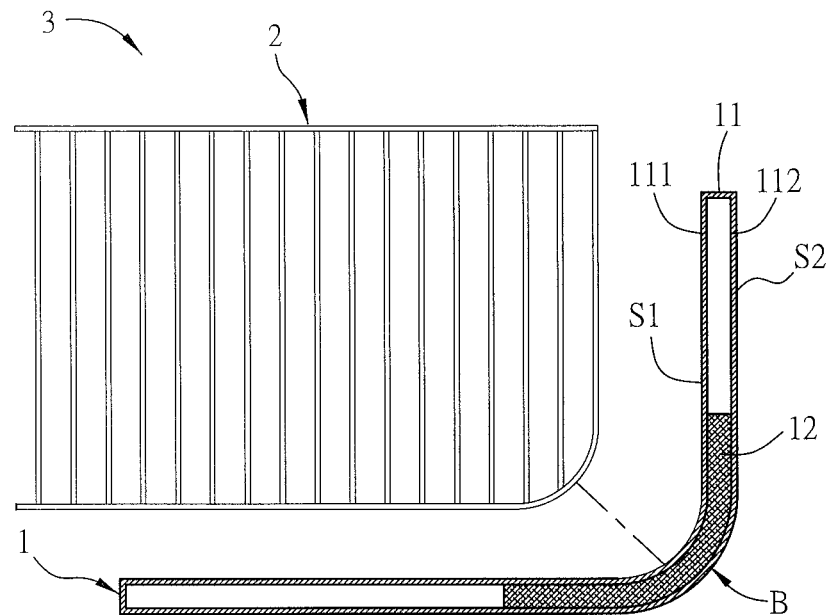
FIGS. 1A and 1B are an exploded view and an assembled view of a heat dissipation device according to an embodiment of the disclosure, respectively.
Figure 1B:
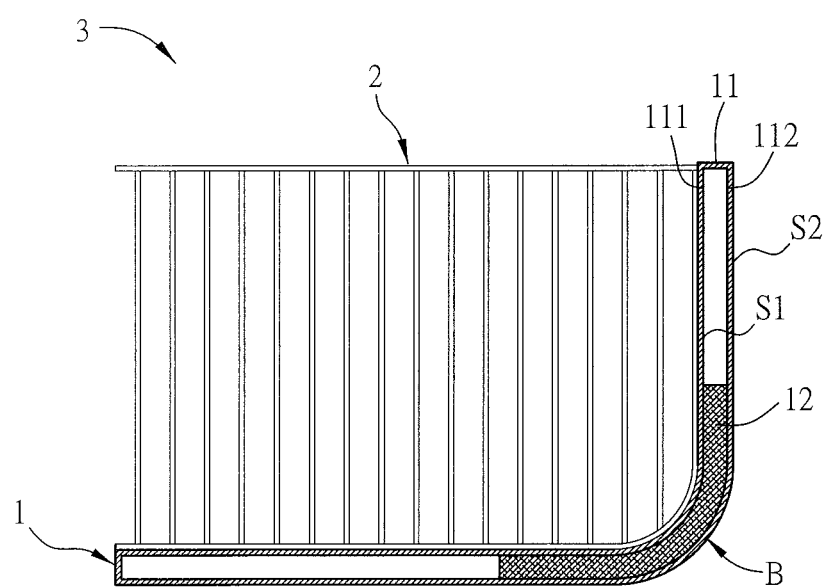

FIGS. 1A and 1B are an exploded view and an assembled view of a heat dissipation device 3 according to an embodiment of the disclosure, respectively.

Referring to FIGS. 1A and 1B, the heat dissipation device 3 includes at least one temperature plate 1 and a cooling fin assembly 2, which are cooperated with and connected to each other.

The temperature plate 1 is also known as a thermal conducting plate. In this embodiment, the temperature plate 1 has a vacuum chamber, and has a wick structure disposed on the inner wall of the vacuum chamber. Besides, a working fluid is filled into the vacuum chamber. When the bottom of the heat dissipation device 3 is contacted with a heat source, the heat energy can be conducted to the temperature plate 1 and the working fluid inside the temperature plate 1 will be evaporated to gaseous state. The gaseous state working fluid can carry the heat energy through the wick structure and then toward outside of the temperature plate 1, and then the heat energy can be dissipated to the environment through the cooling fin assembly 2, which is connected to and contacted with the temperature plate 1. Afterwards, the gaseous state working fluid is cooled down and condensed to liquid state working fluid, which will flow back via the wick structure. Thus, the working fluid can be cyclically flowing in the vacuum chamber.

Figure 2A:
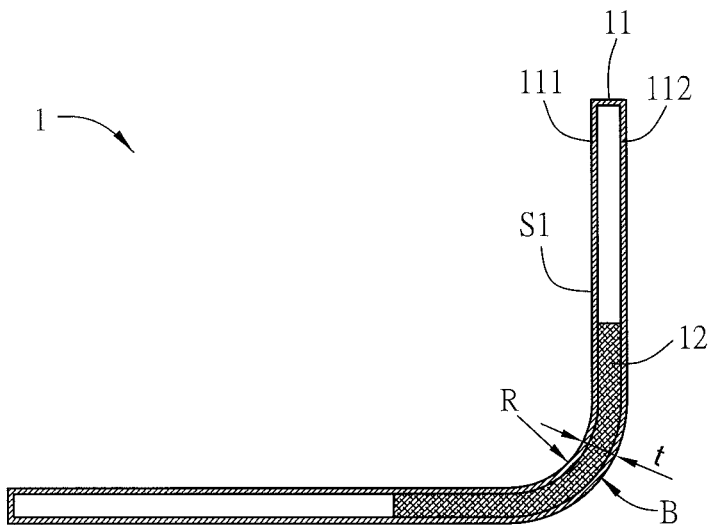
FIGS. 2A and 2B are different side views of the temperature plate according to an embodiment of the disclosure.
Figure 2B:
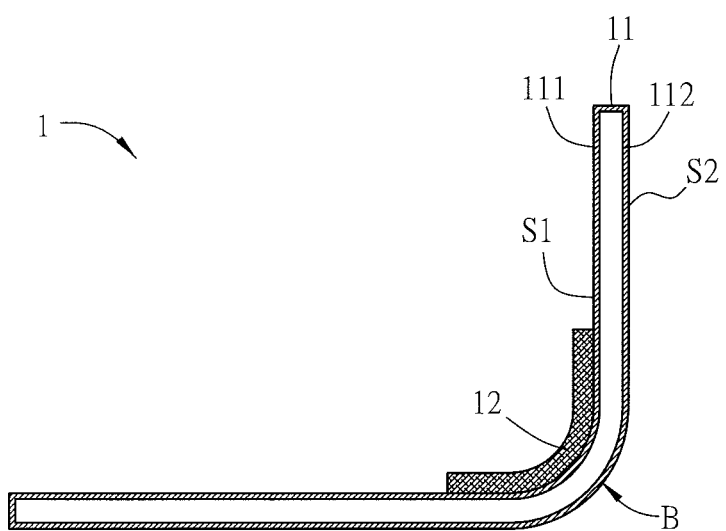

FIGS. 2A and 2B are different side views of the temperature plate 1 according to an embodiment of the disclosure. In this embodiment, the temperature plate 1 includes a plate body 11, which is made of a metal material having a high heat transfer coefficient. The plate body 11 can be formed by a first plate 111 and a second plate 112, which are connected by, for example but not limited to, welding for forming or defining a vacuum chamber therebetween. Of course, the plate body 11 can also be formed by folding, assembling, or bonding a single plate workpiece, and this disclosure is not limited. The plate body 11 has a first surface S1, and the first surface S1 of the plate body 11 is compressed when bending the plate body 11. In other words, the first surface S1 is as the compressive side when bending the plate body 11 to form at least one bent portion B. In this embodiment, the plate body 11 is bent to the left side (FIG. 1A) to form a bent portion B, and the plate body 11 thus has a reversed L shape. Herein, the left side is the compressive side. To be noted, the first surface S1 can be a tensile side when bending the plate body 11, which means the plate body is bent to the opposite side, the right side, as shown in FIG. 1A. As shown in FIG. 2A, a curvature radius R of the bent portion B of the plate body 11 is at least twice of a thickness t of the bent portion B (R≥2t).

In the conventional art, when applying a force to bend the plate body of the temperature plate, it is discovered that the bent portion of the plate body has undesired depression or deformation, which can destroy the wick structure configured on the inner wall of the plate body. This can cause a non-smooth or discontinuous (wick) structure surface so as to decrease the heat dissipating efficiency of the temperature plate. In order to prevent the undesired depression or deformation, the temperature plate 1 of this disclosure further includes at least one supporter 12 disposed corresponding to the bent portion B. In this embodiment, the supporter 12 is disposed inside the vacuum chamber of the temperature plate 1. The supporter 12 can be a structural enhancement member, such as a metal unit, connecting to inner wall of the vacuum chamber and disposed corresponding to the bent portion B. The metal unit can be, for example but not limited to, a copper bar (sheet) or aluminum bar (sheet), and the supporter 12 can be connected to the bent portion B by welding or assembling. The supporter 12 can be made of the same material as the wick structure, and this disclosure is not limited. The supporter 12 can enhance the structural strength of the bent portion B so as to prevent the depression or deformation of the plate body 11 when bending the plate body 11 and also to improve the heat conduction.

In some embodiments, as shown in FIG. 2B, the supporter 12 can be a structural enhancement member (e.g. a metal unit) and connected to the first surface S1 of the first plate 111 (at which) corresponding to the bent portion B. In another embodiment, the supporter 12 can be disposed on the second surface S2 of the second plate 112 corresponding to the bent portion B (not shown).

Figure 2C:
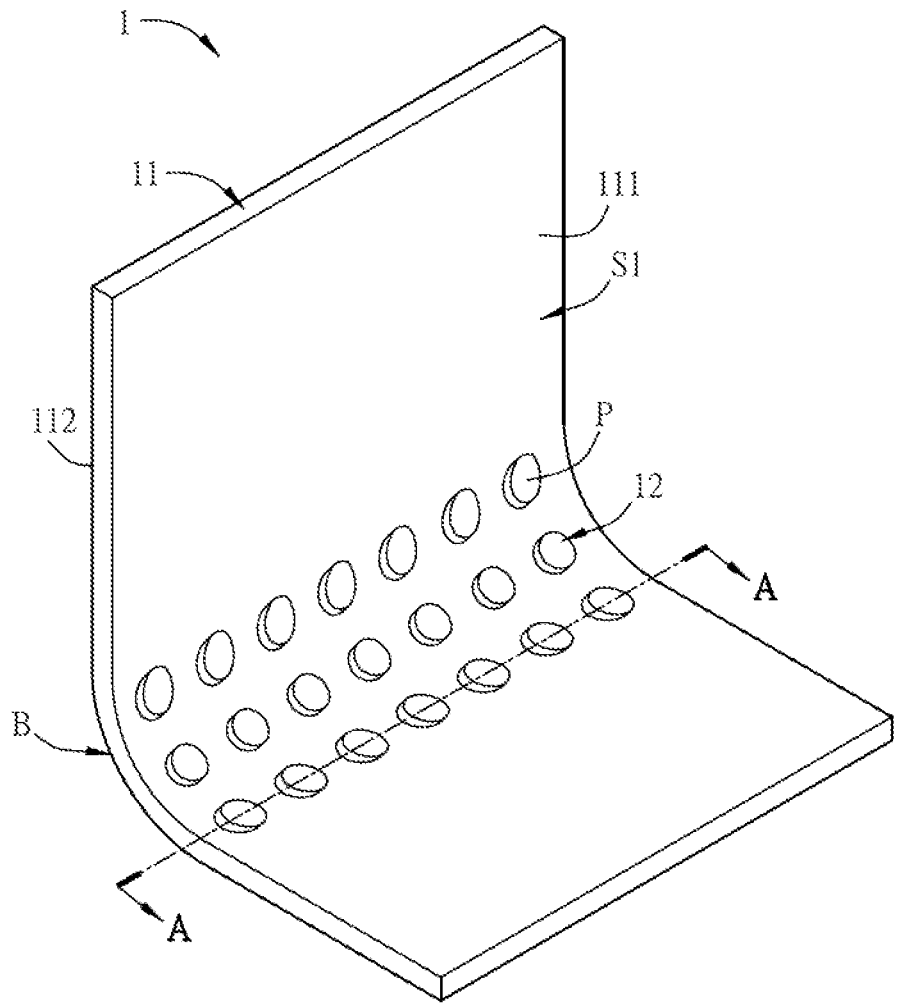
FIGS. 2C and 2D are perspective views of the temperature plates according to different aspects of the disclosure.
Figure 2D:
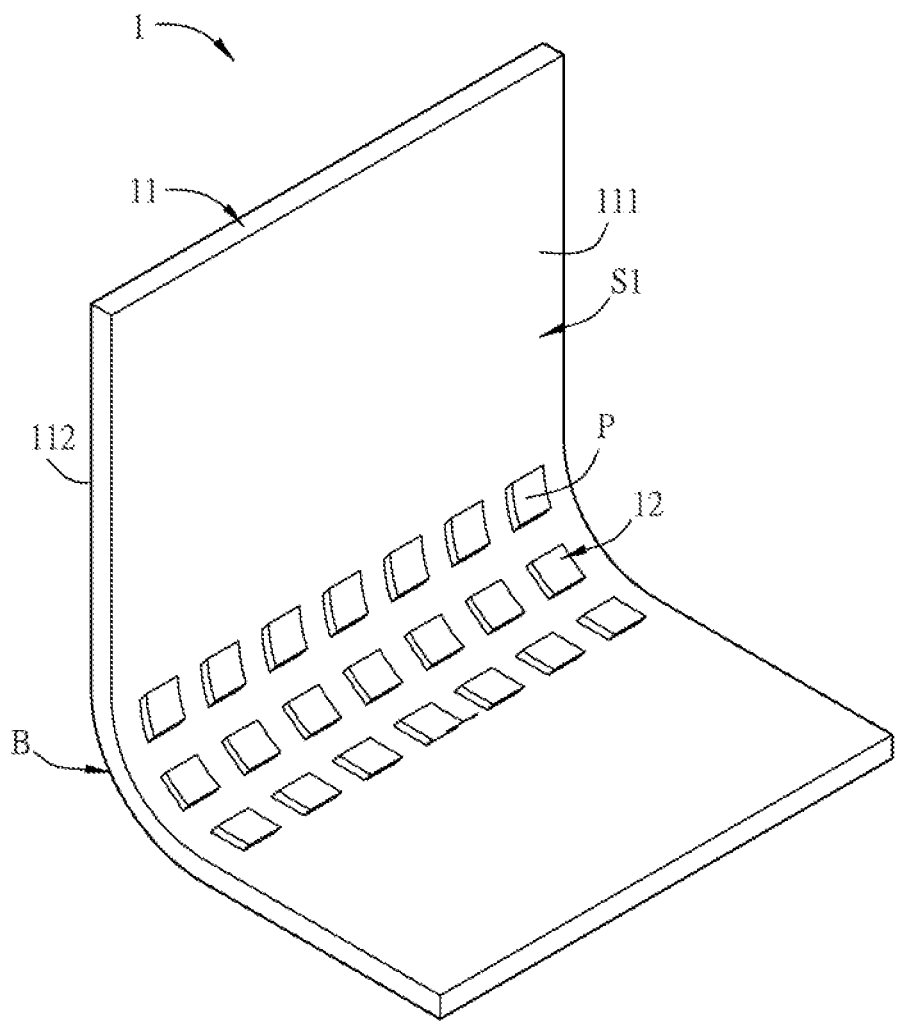

In some embodiments, it is also possible to enhance the structural strength of the bent portion B by constructing the supporter 12 corresponding to the bent portion B and the adjacent part directly. In other words, the part of the first plate 111 or the second plate 112 corresponding to the bent portion B can be processed to increase the structural strength of the bent portion B. FIGS. 2C and 2D are perspective views of the temperature plates according to different aspects of the disclosure. As shown in FIGS. 2C and 2D, a part of the first plate 111 (or the second plate 112) corresponding to the bent portion B is configured with a plurality of protruding portions P or recess portions (not shown) for constructing the supporter 12. In other words, the part of the first plate 111 (or the second plate 112) corresponding to and adjacent to the bent portion B can be processed to generate a plurality of protruding portions P (or recess portions), which can enhance the structural strength of the bent portion B and the adjacent part. This configuration can prevent the undesired depression or deformation when bending the plate body 11. In this embodiment, the protruding portions P can be cylindrical pillars (FIG. 2C) or square pillars (FIG. 2D) or any other suitable shape, or their combinations. In the embodiment of FIGS. 2C and 2D, the protruding portions P are aligned to each other. Of course, this disclosure is not limited thereto. In other embodiments, the protruding portions P are misaligned or arranged irregularly to each other. In addition, the part of the first plate 111 and the part of the second plate 112 corresponding to and adjacent to the bent portion B are both configured with protruding portions P (or recess portions). This configuration can also enhance the structural strength of the bent portion B and the adjacent part.

Figure 2E:
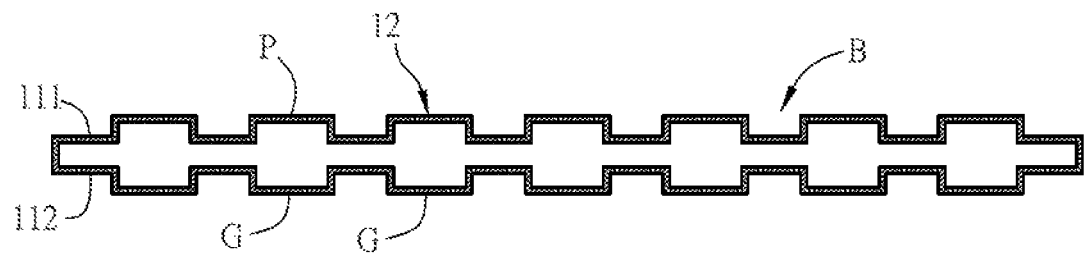
FIG. 2E is a sectional view of FIG. 2C along the line A-A.
Figure 2F:
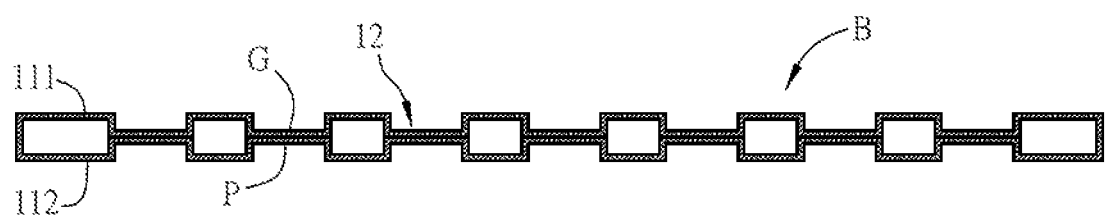
FIGS. 2F and 2G are schematic diagrams showing the protruding portions and/or recess portions of the first plate and the second plate according to different aspects of the disclosure, respectively.
Figure 2G:
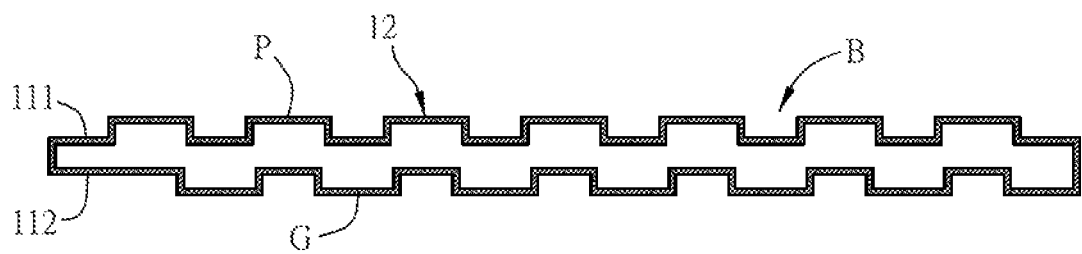

FIG. 2E is a sectional view of FIG. 2C along the line A-A, and FIGS. 2F and 2G are schematic diagrams showing the protruding portions and/or recess portions of the first plate 111 and the second plate 112 according to different aspects of the disclosure, respectively. As shown in FIGS. 2E to 2G, the protrusions of the plates are the protruding portions, and the recesses of the plates are recess portions.

In some embodiments, one of the first plate 111 and the second plate 112 has a plurality of protruding portions P corresponding to the bent portion B, and the other of the first plate 111 and the second plate 112 has a plurality of recess portions G corresponding to the bent portion B. The protruding portions P and the recess portions G construct the supporter 12, and the protruding portions P can be aligned or misaligned to the recess portions G. As shown in FIG. 2E, the part of the first plate 111 corresponding to and adjacent to the bent portion B includes a plurality of protruding portions P, and the part of the second plate 112 corresponding to and adjacent to the bent portion B includes a plurality of recess portions G. The protruding portions P and the recess portions G construct the supporter 12, and the protruding portions P are aligned to the recess portions G.

As shown in FIG. 2F, the part of the first plate 111 corresponding to and adjacent to the bent portion B includes a plurality of recess portions G, and the part of the second plate 112 corresponding to and adjacent to the bent portion B includes a plurality of protruding portions P. The recess portions G and the protruding portions P construct the supporter 12, and the recess portions G are aligned to the protruding portions P.

As shown in FIG. 2G, the part of the first plate 111 corresponding to and adjacent to the bent portion B includes a plurality of protruding portions P, and the part of the second plate 112 corresponding to and adjacent to the bent portion B includes a plurality of recess portions G. The protruding portions P and the recess portions G construct the supporter 12, and the protruding portions P are misaligned to the recess portions G. The above mentioned aspects of the first plates 111, second plates 112, supporters 12, protruding portions P and recess portions G are for illustrations only and are not for limiting the scope of this disclosure.

As mentioned above, in order to enhance the structural strength of the bent portion B and to prevent the depression or deformation of the bent plate body 11, the supporter 12 is provide in the vacuum chamber of the plate body 11 or on the first surface S1 of the first plate 111 or on the second surface S2 of the second plate 112 of the plate body 11. In addition, the plate body 11 can be processed to form protruding portions P and/or recess portions G corresponding to and adjacent to the bent portion B for constructing the supporter 12 to enhance the structural strength of the bent portion B and adjacent part, and to prevent the depression or deformation when bending the plate body 11. Moreover, inner wall of the plate body 11 can be configured with a wick structure for improving the heat dissipation efficiency. The wick structure can be configured based on the shape or trend of the protruding portions P or the recess portions G. Thus, inner wall of the plate body 11 is configured with a continuous wick structure.

Referring to FIGS. 1A and 1B, the cooling fin assembly 2 is disposed at the compressive side and contacted with the first surface S1 of the plate body 11. In this embodiment, the bent portion B can divide the first surface S1 of the plate body 11 into a plurality of regions, and the cooling fin assembly 2 is contacted with at least two of the regions. In more detailed, the heat dissipation device 3 of the embodiment has only one bent portion B, and the first surface S1 of the plate body 11 (excluding the bent portion B) is divided into two parts, including a vertical part and a horizontal part of the plate body 11. The cooling fin assembly 2 is contacted with both of the two parts, and it may contact with a part of the bent portion B under proper conditions. Accordingly, the heat transmitted to the temperature plate 1 can be delivered to the cooling fin assembly 2 through first surface S1 of the bent plate body 11, so that the heat energy can be dissipated to environment via the cooling fin assembly 2. Thus, the heat dissipation device 3 of the embodiment can prevent the undesired depression or deformation while bending plate body 11 of the temperature plate 1, and can provide more conducting paths and a larger contact surface between the temperature plate 1 and the cooling fin assembly 2 via the bent portion B at the first surface S1, thereby improving the heat dissipating efficiency.

Figure 3A:
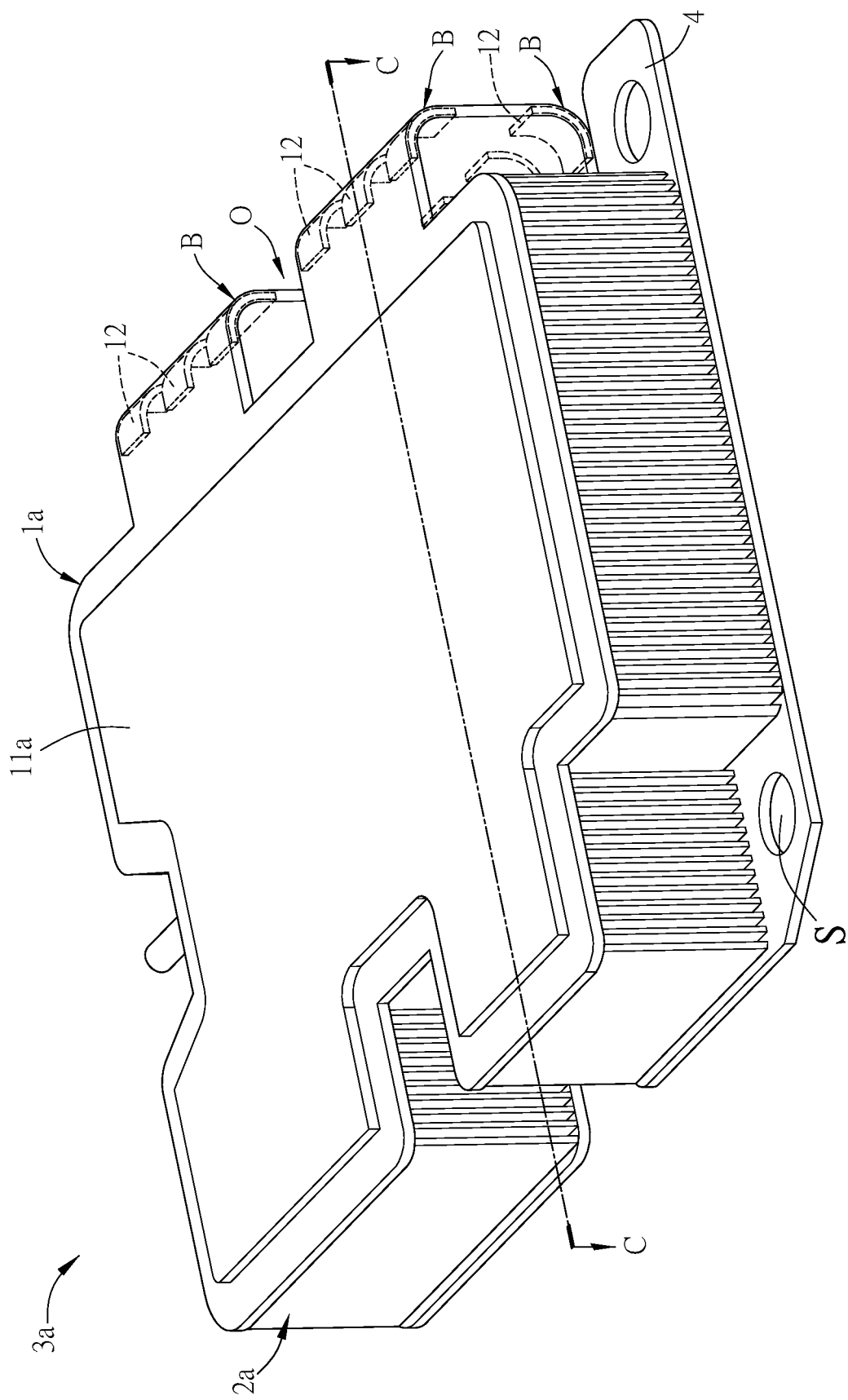
FIG. 3A is a perspective view of the heat dissipation device according to another embodiment of the disclosure.
Figure 3B:
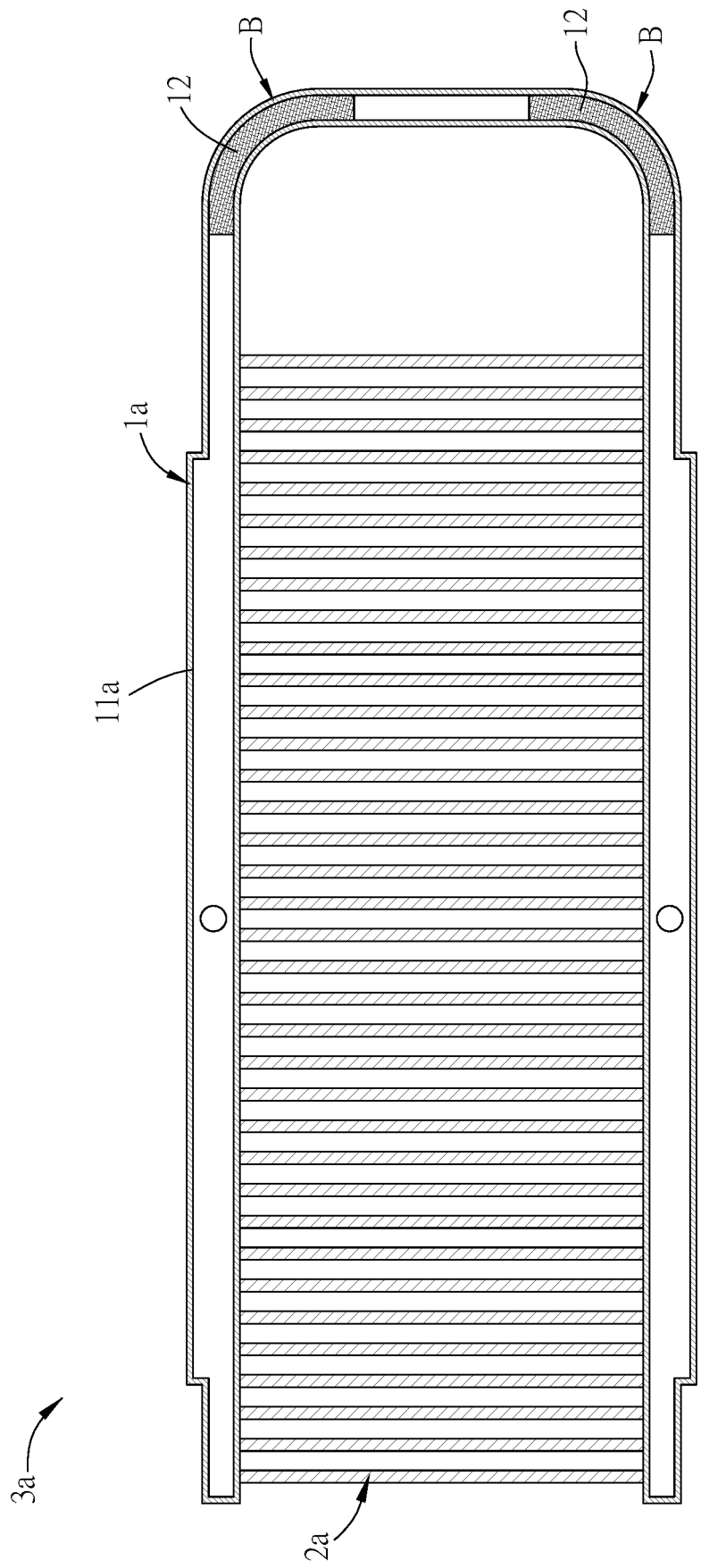
FIG. 3B is a sectional view of FIG. 3A along the broken line C-C.
Figure 4:
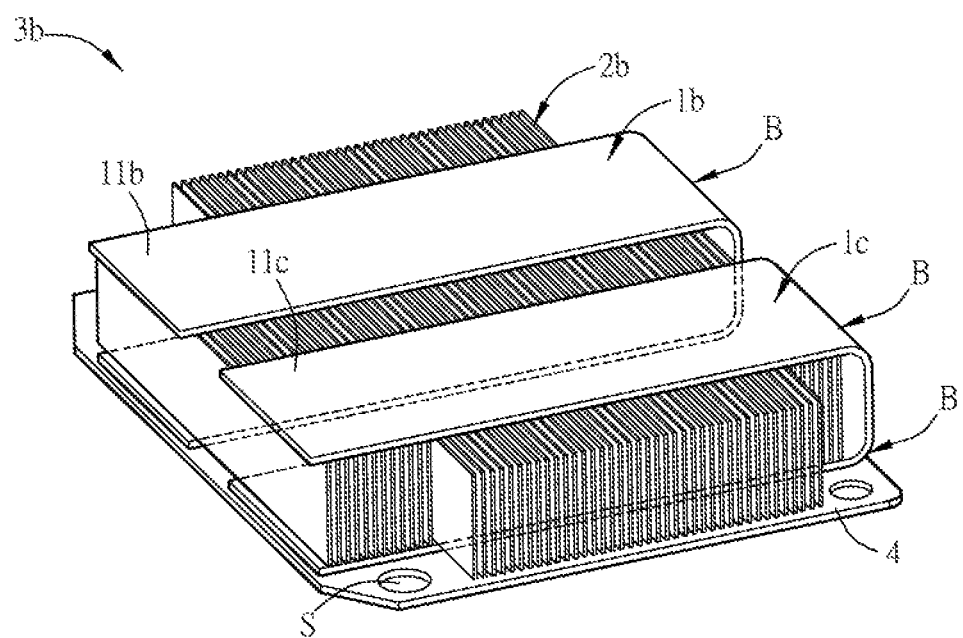
FIG. 4 is a perspective view of the heat dissipation device according to the other embodiment of the disclosure.

FIGS. 3A and 4 are perspective views of the heat dissipation devices 3a and 3b according to different embodiments of the disclosure. FIG. 3B is a sectional view of FIG. 3A along the broken line C-C.

Different from the heat dissipation device 3 of FIG. 1B, a heat dissipation device 3a of this embodiment as shown in FIGS. 3A and 3B includes at least two bent portions B, so that the plate body 11a of the temperature plate 1a has a laid U shape structure. The supporting structure 12 is disposed corresponding to the bent portion B. In more detailed, at least two supporting structures 12 are disposed inside the vacuum chamber of the temperature plate 1a and located corresponding to the at least two bent portions B, respectively. Of course, the at least two supporting structures 12 can also be disposed on the first surface or the second surface of the plate body 11a corresponding to configurations of the at least two bent portions B. The configuration of the at least two bent portions B allows the bent plate body 11a to clip the cooling fin assembly 2a. The cooling fin assembly 2a contacts to the inner surface of the laid U-shaped plate body 11a. In this case, the cooling fin assembly 2a contacts to the inner top surface and the inner bottom surface of the plate body 11a, which are disposed adjacent to the at least two bent portions B and are both not bent, i.e., they are flat portions. The part of the plate body 11a between the at least two bent portions B is not contacted with the cooling fin assembly 2a. Of course, in other embodiments, the cooling fin assembly 2a may contact to the part of the plate body 11a between the at least two bent portions B. In addition, the plate body 11a may further have an opening O corresponding to the bent portions B for installing additional components, such as a fixing member or a heat pipe.

In addition, the heat dissipation device 3a further includes a heat conducting plate 4. The heat conducting plate 4 can be made of metal or other high heat conducting material, which can be the same or different from the material of the temperature plate 1a and/or the cooling fin assembly 2a. In this embodiment, the temperature plate 1a and the cooling fin assembly 2a are disposed on the heat conducting plate 4. When the heat source (not shown) contacts to bottom surface of the heat conducting plate 4, the heat energy can be transferred to the temperature plate 1a and the cooling fin assembly 2a via the heat conducting plate 4 and then dissipated to the environment through the temperature plate 1a and the cooling fin assembly 2a. In addition, the heat conducting plate 4 may have at least a screw hole or a fastening hole S for assembling with the external heating component.

Different from the heat dissipation device 3a of FIG. 3A, a heat dissipation device 3b of this embodiment as shown in FIG. 4 includes two temperature plates 1b and 1c. Each of the temperature plates 1b and 1c has two bent portions B, so that each of the plate bodies 11b and 11c of the temperature plates 1b and 1c has a U shape structure. The supporting structure (not shown) is disposed corresponding to the bent portion B. In this case, four supporting structures are disposed inside the vacuum chambers of the temperature plates 1b and 1c and be located corresponding to the four bent portions B. Of course, the four supporting structures can also be disposed on the surfaces of the plate bodies 11b and 11c corresponding to the bent portions B. The bent plate bodies 11b and 11c can together clip the cooling fin assembly 2b, and the cooling fin assembly 2b contacts to inner surfaces of the laid U-shaped plate bodies 11b and 11c. In this embodiment, the cooling fin assembly 2b contacts to inner top surfaces and inner bottom surfaces of the plate bodies 11b and 11c, which are disposed adjacent to the bent portions B and are not bent, i.e., they are flat portions. The parts of the plate bodies 11b and 11c between the bent portions B are not contacted with the cooling fin assembly 2b. Of course, in other embodiments, the cooling fin assembly 2b may contact to the parts of the plate bodies 11b and 11c between the bent portions B, and this disclosure is not limited. In addition, the temperature plates 1b and 1c and the cooling fin assembly 2b are disposed on the heat conducting plate 4. When the heat source contacts to bottom surface of the heat conducting plate 4, the heat energy can be transferred to the temperature plates 1b and 1c and the cooling fin assembly 2b via the heat conducting plate 4 and then dissipated to the environment through the temperature plates 1b and 1c and the cooling fin assembly 2b.

The other technical features of the heat dissipation devices 3a and 3b (e.g. the temperature plates 1b and 1c and the heat conducting plate 4) can be referred to the heat dissipation devices 3 in the previous embodiment, so the detailed descriptions thereof will be omitted.

To sum up, in the temperature plate and heat dissipation device of the disclosure, the supporter is disposed corresponding to the bent portion of the plate body of the temperature plate for enhancing the structural strength of the bent portion. This configuration can prevent the depression or deformation of the temperature plate when bending the temperature plate. In addition, the cooling fin assembly is disposed at the compressive side of the bent plate body and contacted with the first surface of the plate body, so that more conducting paths and a larger contact surface can be provided between the temperature plate and the cooling fin assembly through the bent portion, thereby improving the heat dissipating efficiency.

Although the present disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present disclosure.

What is claimed is:

1. A temperature plate, comprising:
   a plate body comprising a first plate and a second plate, wherein a vacuum chamber is defined by the first plate and the second plate, the first plate has a first external surface, and the plate body is bent to form at least two bent portions with the first external surface being a compressive side; and
   at least two supporters bent and disposed inside the vacuum chamber, located corresponding to the at least two bent portions and connected to an inner wall of the vacuum chamber to enhance a structural strength of the at least two bent portions and also to improve heat conduction, wherein the at least two supporters stop extending at flat portions of the plate body;
   wherein the temperature plate is combined with a cooling fin assembly, the cooling fin assembly is disposed on the first external surface, the configuration of the at least two bent portions allows the plate body to clip the cooling fin assembly.

2. The temperature plate of claim 1, wherein a curvature radius of the bent portion is at least twice of a thickness of the bent portion.

3. The temperature plate of claim 1, wherein the at least two supporters are metal units.

4. The temperature plate of claim 1, wherein the second plate has a second external surface, and the at least two supporters are between the first external surface and the second external surface.

5. The temperature plate of claim 1, wherein the first plate and the second plate are two plate portions of a plate workpiece, and the plate workpiece is bent to form the two plate portions.

6. The temperature plate of claim 1, wherein the first plate or the second plate has a plurality of protruding portions at the bent portion, the protruding portions construct the supporter, and the protruding portions are aligned or misaligned to each other.

7. The temperature plate of claim 1, wherein one of the first plate and the second plate has a plurality of protruding portions at the bent portion, the other one of the first plate and the second plate has a plurality of recess portions at the bent portion, the protruding portions and the recess portions construct the supporter, and the protruding portions are aligned or misaligned to the recess portions.

* * * * *